United States Patent
Lin et al.

(10) Patent No.: US 11,075,087 B2
(45) Date of Patent: *Jul. 27, 2021

(54) FOCUS RING FOR PLASMA ETCHER

(71) Applicant: Taiwan Semiconductor Manufacturing Company, Ltd., Hsinchu (TW)

(72) Inventors: Yu-Chi Lin, Hsinchu (TW); Chin-Hsing Lin, Chiayi (TW); Hung Jui Chang, Shetou Shiang (TW); Yi-Wei Chiu, Kaohsiung (TW); Yu-Wei Kuo, Hsinchu (TW); Yu Lun Ke, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/663,991

(22) Filed: Oct. 25, 2019

(65) Prior Publication Data

US 2020/0058513 A1 Feb. 20, 2020

Related U.S. Application Data

(60) Continuation of application No. 16/594,598, filed on Oct. 7, 2019, which is a division of application No.
(Continued)

(51) Int. Cl.
*H01L 21/306* (2006.01)
*H01L 21/3065* (2006.01)
(Continued)

(52) U.S. Cl.
CPC .... *H01L 21/3065* (2013.01); *H01J 37/32642* (2013.01); *H01J 37/32715* (2013.01);
(Continued)

(58) Field of Classification Search
CPC .......... H01L 21/3065; H01L 21/31116; H01L 21/67069; H01L 21/6831; H01L 21/68785;
(Continued)

(56) References Cited

U.S. PATENT DOCUMENTS 6,210,593 B1 4/2001 Ohkuni et al.
10,504,738 B2 * 12/2019 Lin .................. H01J 37/32715
(Continued)

*Primary Examiner* — Duy Vu N Deo
(74) *Attorney, Agent, or Firm* — Slater Matsil, LLP

(57) ABSTRACT

A method includes mounting a wafer on a chuck disposed within a chamber of an etching system, the wafer being encircled by a focus ring. While etching portions of the wafer, an etch direction is adjusted to a first desired etch direction by adjusting a vertical position of the focus ring relative to the wafer to a first desired vertical position. While etching portions of the wafer, the etch direction is adjusted to a second desired etch direction by adjusting the vertical position of the focus ring relative to the wafer to a second desired vertical position. The second desired vertical position is different from the first desired vertical position. The second desired etch direction is different from the first desired etch direction.

20 Claims, 17 Drawing Sheets

Related U.S. Application Data

15/966,715, filed on Apr. 30, 2018, now Pat. No. 10,504,738.

(60) Provisional application No. 62/513,079, filed on May 31, 2017.

(51) Int. Cl.
*H01J 37/32* (2006.01)
*H01L 21/311* (2006.01)
*H01L 21/67* (2006.01)
*H01L 21/683* (2006.01)
*H01L 21/687* (2006.01)

(52) U.S. Cl.
CPC .. *H01L 21/31116* (2013.01); *H01L 21/67069* (2013.01); *H01L 21/6831* (2013.01); *H01L 21/68785* (2013.01); *H01J 2237/334* (2013.01)

(58) Field of Classification Search
CPC .......... H01L 21/76816; H01L 21/32137; H01J 37/32642; H01J 37/32715; H01J 2237/334; H01J 37/3299
See application file for complete search history.

(56) References Cited

U.S. PATENT DOCUMENTS

| | | | |
|---|---|---|---|
| 10,658,184 B2 * | 5/2020 | Shen | H01L 21/31144 |
| 2004/0149389 A1 * | 8/2004 | Fink | H01J 37/32642 |
| | | | 156/345.51 |
| 2017/0032987 A1 | 2/2017 | Lee et al. | |
| 2017/0263460 A1 * | 9/2017 | Ruffell | H01L 21/76879 |
| 2018/0315640 A1 | 11/2018 | Ueda et al. | |

* cited by examiner

FOCUS RING FOR PLASMA ETCHER

PRIORITY CLAIM AND CROSS-REFERENCE

This application is a continuation of U.S. Patent Application Ser. No. 16/594,598, filed on Oct. 7, 2019, and entitled "Focus Ring for Plasma Etcher," which is a divisional of U.S. patent application Ser. No. 15/966,715, filed on Apr. 30, 2018, and entitled "Focus Ring for Plasma Etcher," which claims the benefit of U.S. Provisional Application Ser. No. 62/513,079, filed on May 31, 2017, entitled "Focus Ring for Plasma Etcher," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
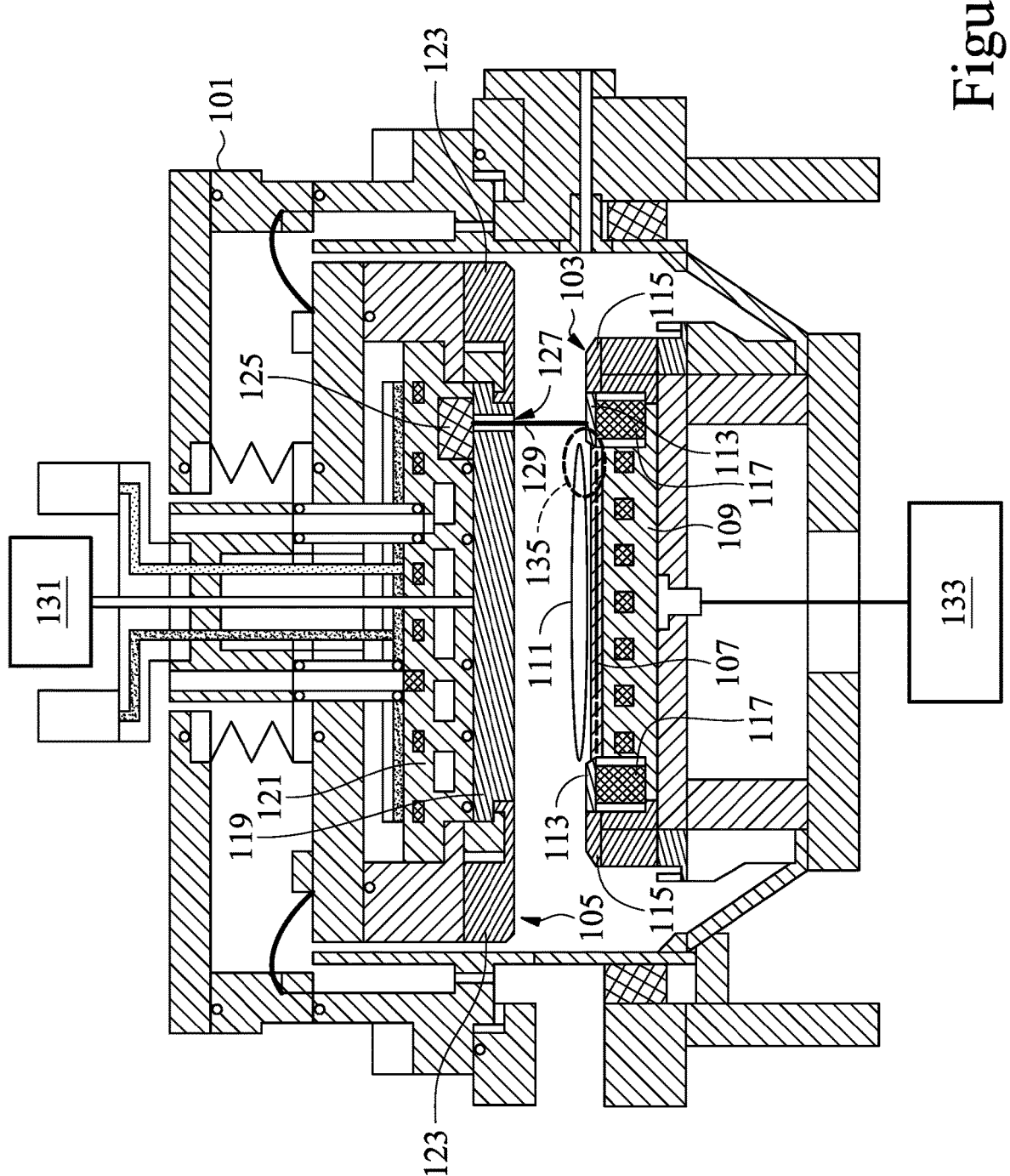
FIG. 1 illustrates a cross-sectional view of an etching system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A tool of manufacture for a semiconductor device is described in accordance with various embodiments. In particular, the tool of manufacture may be an etching system having a focus ring encircling a wafer being processed. In some embodiments, the focus ring of the etching system is configured to move vertically relative to the wafer during an etching process. In some embodiments, the etching system may include a detector configured to detect a vertical position of the focus ring and a feedback system configured to adjust the vertical position of the focus ring relative to the wafer based on the detected vertical position. Adjusting the vertical position of the focus ring relative to the wafer allows for dynamically controlling a direction of ions used during the etching processes. In various embodiments, controlling the ion direction by moving the focus ring relative to wafer may allow for improved overlay control between various features of a semiconductor structure (for example, between a conductive via and an underlying conductive feature of an interconnect structure of a semiconductor device). Various embodiments discussed herein further allow for dynamically controlling the direction of ions used during the etching processes to form features having desired etch profiles and dimensions.

FIG. 1 illustrates a cross-sectional view of an etching system 100 in accordance with some embodiments. In some embodiments, the etching system 100 includes a chamber 101, which is a vacuum chamber. The etching system 100 includes a lower stage 103 and an upper stage 105 within the chamber 101. The lower stage 103 includes a chuck 107 and a bottom conductive plate 109 below the chuck 107. In the illustrated embodiment, the chuck 107 is an electrostatic chuck. In other embodiments, the chuck 107 may be a vacuum chuck, or the like. A wafer 111, which is to be etched, is placed on, and is secured by, the chuck 107. The lower stage 103 further includes a focus ring 113, a cover ring 115, and a focus ring control system 117. In some embodiments, the focus ring 113 has a shape of a ring in a plan view and encircles the wafer 111. In some embodiments, the focus ring 113 may be formed of silicon, silicon carbide, quartz, a combination thereof, or the like. In some embodiments, the cover ring 115 also has a shape of a ring in a plan view and encircles the focus ring 113. In some embodiments, the cover ring 115 may be formed of quartz, or the like. In some embodiments, the focus ring control system 117 comprises an actuator, such as a servo motor, which is mechanically coupled to the focus ring 113 and is configured to adjust a vertical position of the focus ring 113 relative to the wafer 111.

The upper stage 105 includes a top plate 119, a cooling plate 121 over the top plate 119, and a top shield ring 123 encircling the top plate 119. The top plate 119 and wafer 111 define a space between them, where the process gas for etching the wafer 111 is introduced. In some embodiments, the top plate 119 overlaps the wafer 111, and may have an area at least equal to or larger than the wafer 111. In some embodiments, the top plate 119 has a circular shape in a plan view. In some embodiments, the cooling plate 121 is formed of a material having a good thermal conductivity, which may be a metallic material, such as aluminum or an aluminum alloy. In some embodiments, the cooling plate 121 is hollow, with conduits formed inside to allow coolant such as cool air, water, oil, etc. to flow through, so that heat may be conducted away from the top plate 119. In some embodiments, the cooling plate 121 may be in physical contact with the top plate 119. In some embodiments, the cooling plate 121 may have a circular shape in a plan view. In some embodiments, the top shield ring 123 may have a shape of a ring in a plan view. In some embodiments, the top shield ring 123 may be formed of quartz, or the like.

In some embodiments, the upper stage 105 further includes a detector 125 interposed between the top plate 119 and the cooling plate 121. In some embodiments, the detector 125 is configured to detect the vertical position of the focus ring 113. In some embodiments, the detector 125 may be configured to detect a distance between the detector 125 and the focus ring 113. In some embodiments, the detector 125 is a laser detector. In such embodiments, the top plate 119 may comprise a hole 127 to allow unimpeded transmissions of a laser beam 129. In some embodiments, the etching system 100 further includes a feedback system (not shown), which in combination with the focus ring 113, the focus ring control system 117 and the detector 125 forms a feedback loop for dynamically controlling the vertical position of the focus ring 113. A schematic diagram of such a feedback loop 200 is illustrated in FIG. 2 in accordance with some embodiments.

Figure 2:
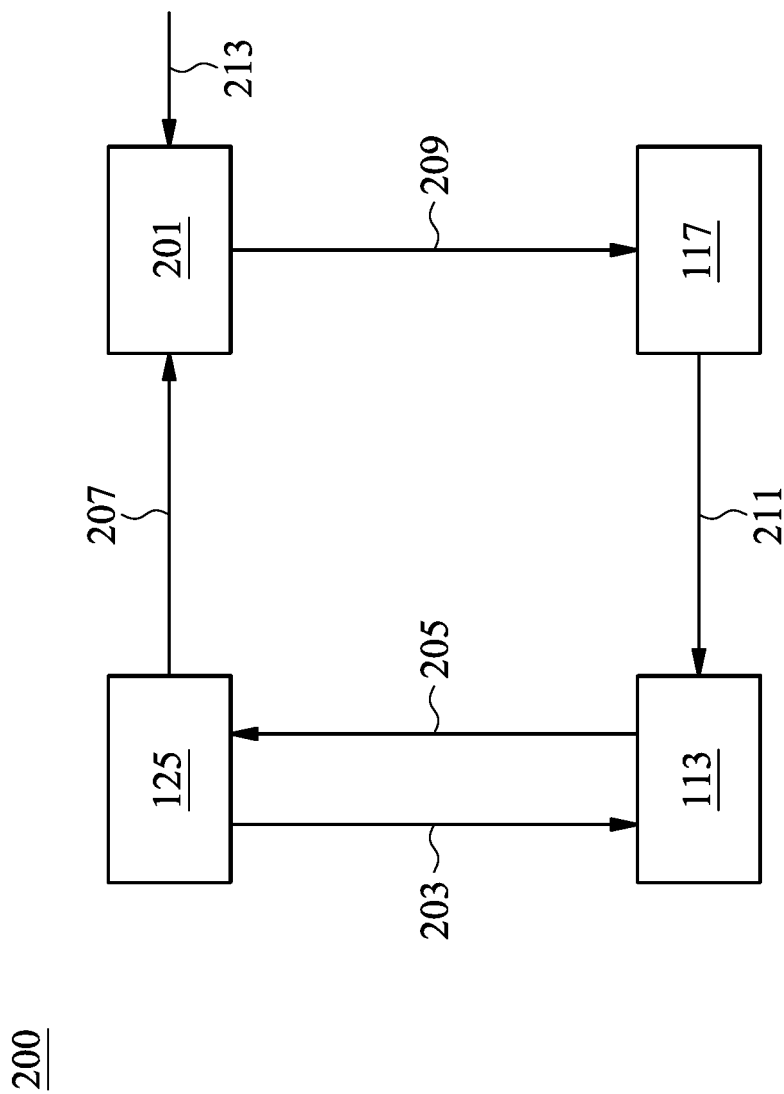
FIG. 2 illustrates a schematic diagram of a feedback loop for controlling a focus ring accordance with some embodiments.

Referring to FIG. 2, the feedback loop 200 includes the focus ring 113, the focus ring control system 117, the detector 125 and a feedback system 201. In some embodiments where the detector 125 is a laser detector, the detector 125 transmits a transmitted laser beam 203 toward a top surface of the focus ring 113 and receives a reflected laser beam 205 reflected from the top surface of the focus ring 113. Based on the transmitted laser beam 203 and the reflected laser beam 203, the detector 125 detects the vertical position of the focus ring 113 (or a distance between the detector 125 and the focus ring 113) and generates a sense signal 207. In some embodiments, the feedback system 201 receives the sense signal 207 generated by the detector 125. In other embodiments, the feedback system 201 receives a user-generated signal 213 generated by a user based on a desired vertical position of the focus ring 113 (or a desired distance between the detector 125 and the focus ring 113). In yet other embodiments, the feedback system 201 receives the sense signal 207 and the user-generated signal 213. Based on at least one of the sense signal 207 and the user-generated signal 213, the feedback system 201 generates a control signal 209. In some embodiments, the focus ring control system 117 receives the control signal 209 and adjusts the vertical position of the focus ring 113 using a mechanical coupling 211 between the focus ring control system 117 and the focus ring 113. In some embodiments, the vertical position of the focus ring 113 is adjusted based on the control signal 209 generated by the feedback system 201. In some embodiments, the feedback system 201 may be disposed within the chamber 101 (see FIG. 1). In some embodiments, the feedback system 201 may be disposed outside the chamber 101 (see FIG. 1).

Referring back to FIG. 1, the etching system 100 further includes a gas supply system 131 and a radio frequency (RF) system 133. In some embodiments, the gas supply system 131 is connected the upper stage 105 and is configured to introduce a desired process gas mixture into the space between the top plate 119 and the wafer 111. In some embodiments, the RF system 133 is coupled to the bottom conductive plate 109 of the lower stage 103 is configured to generate plasma in the space between the top plate 119 and the wafer 111 from the process gas mixture provided by the gas supply system 131.

Figure 3A:
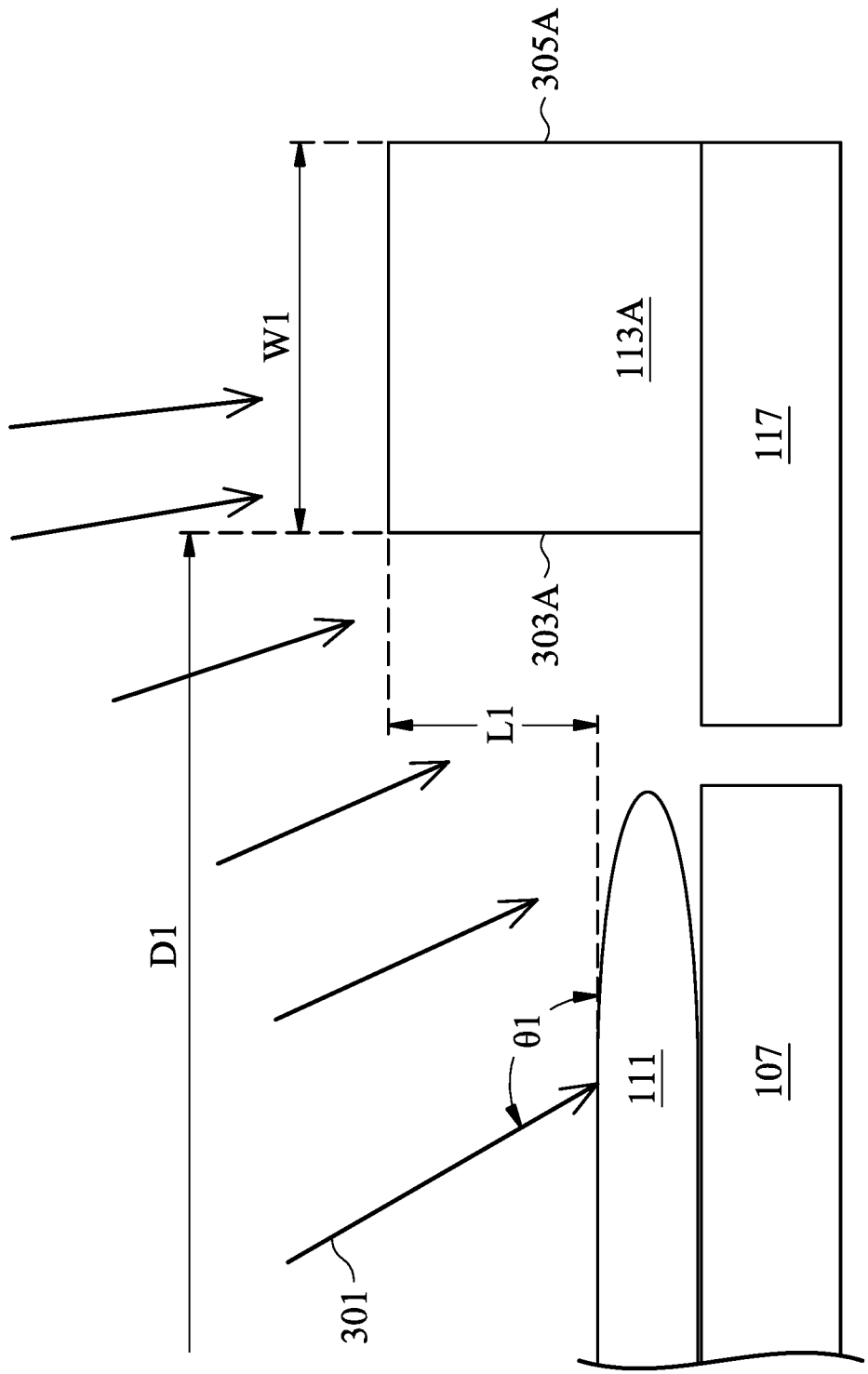
FIG. 3A illustrates a cross-sectional view of a portion of an etching system in accordance with some embodiments.

FIG. 3A illustrates a cross-sectional view of a portion 135 of the etching system 100 (see FIG. 1) in accordance with some embodiments. In some embodiments, a vertical position of the focus ring 113A may be adjusted to adjust a direction 301 of ions of the plasma used for etching the wafer 111. By adjusting the direction 301 of ions, the etching direction is adjusted. By adjusting a distance (gap) L1 between a top surface of the wafer 111 and a top surface of the focus ring 113A, an angle θ1 formed by the direction 301 of the ions and the top surface of the wafer 111 is adjusted. In some embodiments, the focus ring 113A may have a vertical inner sidewall 303A and a vertical outer sidewall 305A, such that the focus ring 113A may have a rectangular shape in a cross-sectional view. In some embodiments where the focus ring 113A has a plan view shape of a ring, the focus ring 113A may have an inner diameter D1 between about 302 mm and about 314 mm. In some embodiments, the focus ring 113A has a width W1 between about 20 mm and about 30 mm. In some embodiments where the focus ring 113A has a plan-view shape of a ring, the width W1 is equal to a difference between an inner radius and an outer radius of the focus ring 113A.

Figure 3B:
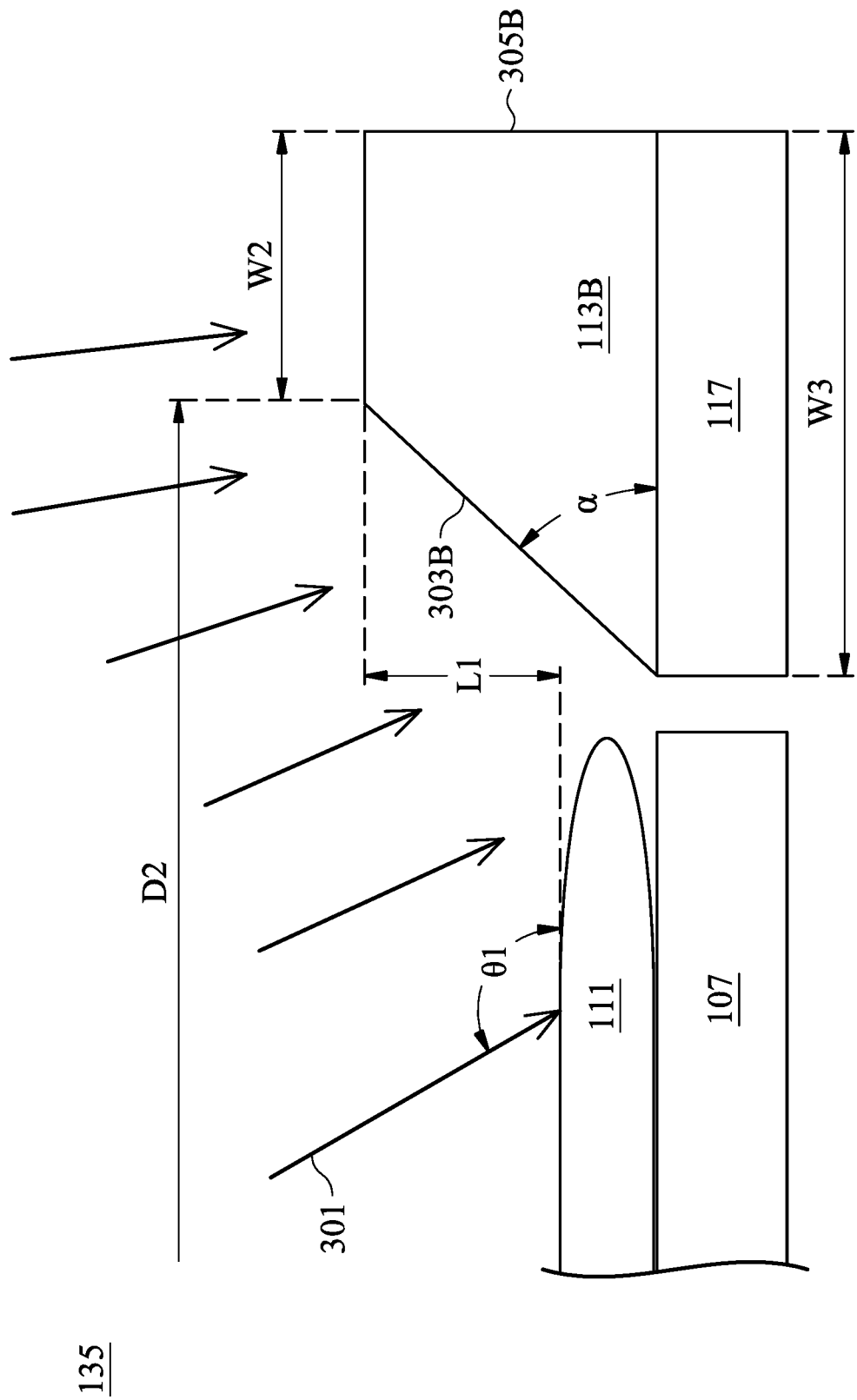
FIG. 3B illustrates a cross-sectional view of a portion of an etching system in accordance with some embodiments.

FIG. 3B illustrates a cross-sectional view of a portion 135 of the etching system 100 (see FIG. 1) in accordance with some embodiments. In some embodiments, a vertical position of the focus ring 113B may be adjusted to adjust a direction 301 of ions of the plasma. By adjusting the direction 301 of ions, the etching direction is adjusted. By adjusting a distance (gap) L1 between a top surface of the wafer 111 and a top surface of the focus ring 113B, an angle θ1 formed by the direction 301 of the ions and the top surface of the wafer 111. In some embodiments, the focus ring 113B may have a non-vertical inner sidewall 303B and a vertical outer sidewall 305B, such that the focus ring 113B may have a trapezoidal shape in a cross-sectional view. In some embodiments, the non-vertical inner sidewall 303B of the focus ring 113B forms an angle α with a bottom surface of the focus ring 113B. In some embodiments, the angle α may be between about 30 degrees and about 60 degrees. In some embodiments where the focus ring 113B has a plan-view shape of a ring, the focus ring 113B may have an inner diameter D2 between about 302 mm and about 314 mm. In some embodiments, a top surface of the focus ring 113B has a width W2 between about 10 mm and about 15 mm. In some embodiments, a bottom surface of the focus ring 113B has a width W3 between about 20 mm and about 30 mm.

Figure 4:
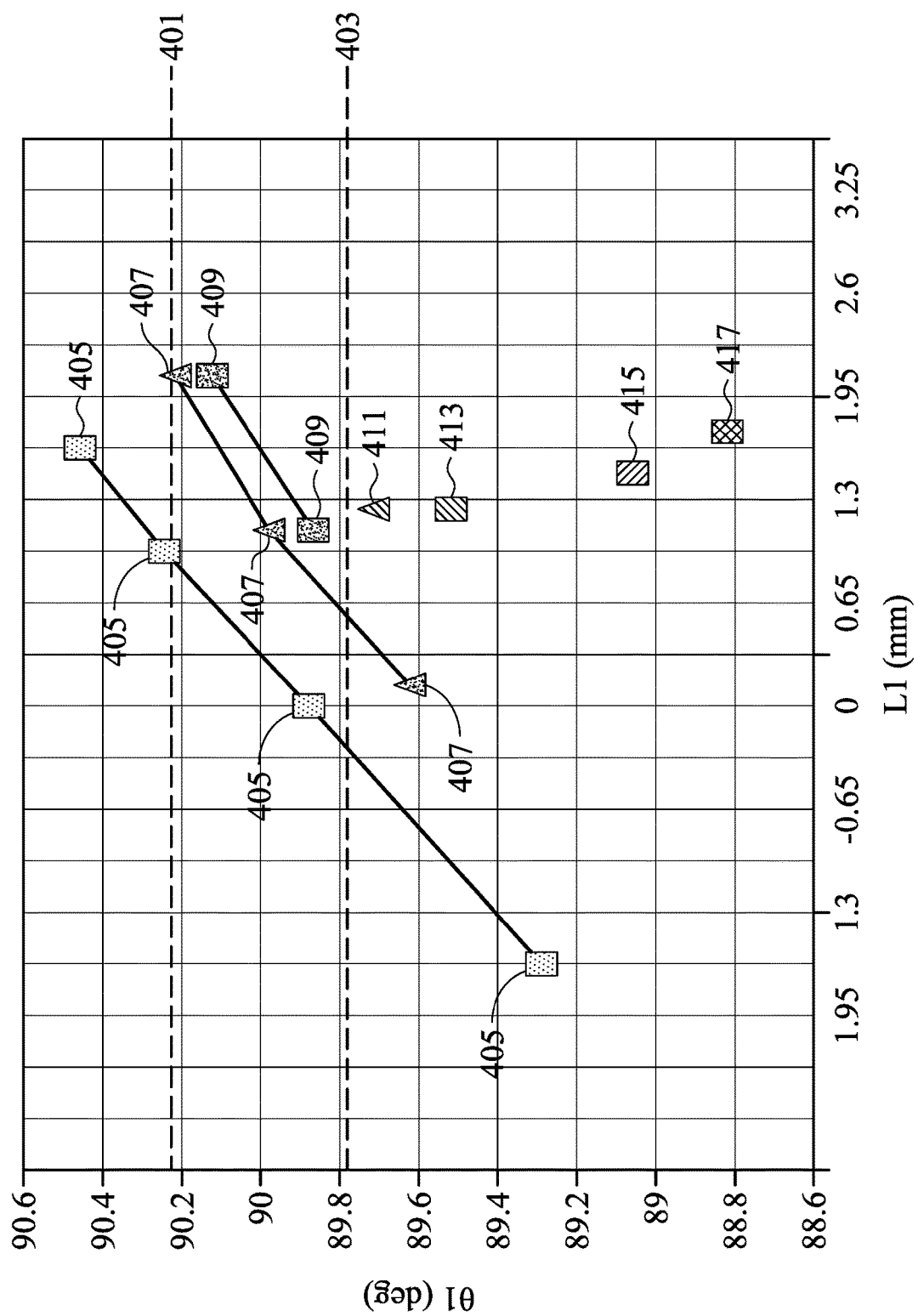
FIG. 4 illustrates a plot of an angle of ions versus a distance between a top surface of a focus ting and a top surface of a wafer in accordance with some embodiments.

FIG. 4 illustrates a plot of the angle θ1 of ions versus the distance L1 between the top surface of the focus ring 113 and the top surface of the wafer 111 (see FIGS. 1, 3A and 3B) in accordance with some embodiments. The negative values for the distance L1 (see FIGS. 3A and 3B) indicate that the top surface of the focus ring 113 is below the top surface of the wafer 111, while the positive values for the distance L1 indicate that the top surface of the focus ring 113 is above the top surface of the wafer 111. Rectangular labels 405 illustrate the dependence of the angle θ1 on the distance L1 for a focus ring with a vertical inner sidewall having an inner diameter of about 302 mm. Triangular labels 407 illustrate the dependence of the angle θ1 on the distance L1 for a focus ring with a non-vertical inner sidewall having an inner diameter of about 304 mm. Rectangular labels 409 illustrate the dependence of the angle θ1 on the distance L1 for a focus ring with a vertical inner sidewall having an inner diameter of about 304 mm. Triangular label 411 illustrates the dependence of the angle θ1 on the distance L1 for a focus ring with a non-vertical inner sidewall having an inner diameter of about 306 mm. Rectangular label 413 illustrates the dependence of the angle θ1 on the distance L1 for a focus ring with a vertical inner sidewall having an inner diameter of about 306 mm. Rectangular label 415 illustrates the dependence of the angle θ1 on the distance L1 for a focus ring with a vertical inner sidewall having an inner diameter of about 310 mm. Rectangular label 417 illustrates the dependence of the angle θ1 on the distance L1 for a focus ring with a vertical inner sidewall having an inner diameter of about 314 mm.

Referring further to FIG. 4, in some embodiments, the distance L1 may be adjusted as described above with reference to FIGS. 1 and 2, such that the of the angle θ1 is close to 90 degrees. In some embodiments, the angle θ1 may be adjusted to be close to 90 degrees within a range defined by a lower limit (LL) 403 and an upper limit (UL) 401. The range defined by the lower limit (LL) 403 and the upper limit (UL) 401 as illustrated if FIG. 4 is provided for illustrative purposes only and is not meant to be limiting. In other embodiments, the angle θ1 may be adjusted to be close to 90 degrees within narrower or wider range depending on the design requirements. In some embodiments, increasing the inner diameter of the focus ring (for example, inner diameters greater than about 306 mm) without changing the shape of the focus ring may not be beneficial for adjusting the angle θ1 within the desired range between the lower limit (LL) 403 and the upper limit (UL) 401. In some embodiments, for focus rings of the same diameter, the focus rings with non-vertical inner sidewalls (such as the focus rings 113B illustrated in FIG. 3B) may allow for a greater control of the angle θ1 compared to the focus rings with vertical inner sidewalls (such as the focus rings 113B illustrated in FIG. 3B).

In some embodiments, ions having the angle θ1 (see FIGS. 3A and 3B) different from 90 degrees may cause the overlay shift between various features of a semiconductor structure (for example, between a conductive via and an underlying conductive feature of an interconnect structure of a semiconductor device), which may be more pronounced at the edges of the wafer 111 (see FIGS. 3A and 3B). As described below in greater detail with reference to FIGS. 5A-5C, by adjusting the angle θ1 (see FIGS. 3A and 3B) of ions to be close to 90 degrees, the overlay shift between various features of a semiconductor structure may be reduced or eliminated. Furthermore, as described below in greater detail with reference to FIGS. 6A-6D and 7A-7C, by dynamically controlling the angle θ1 of ions during the etching processes, desired etch profiles of various features of a semiconductor structure may be formed.

Figure 5A:
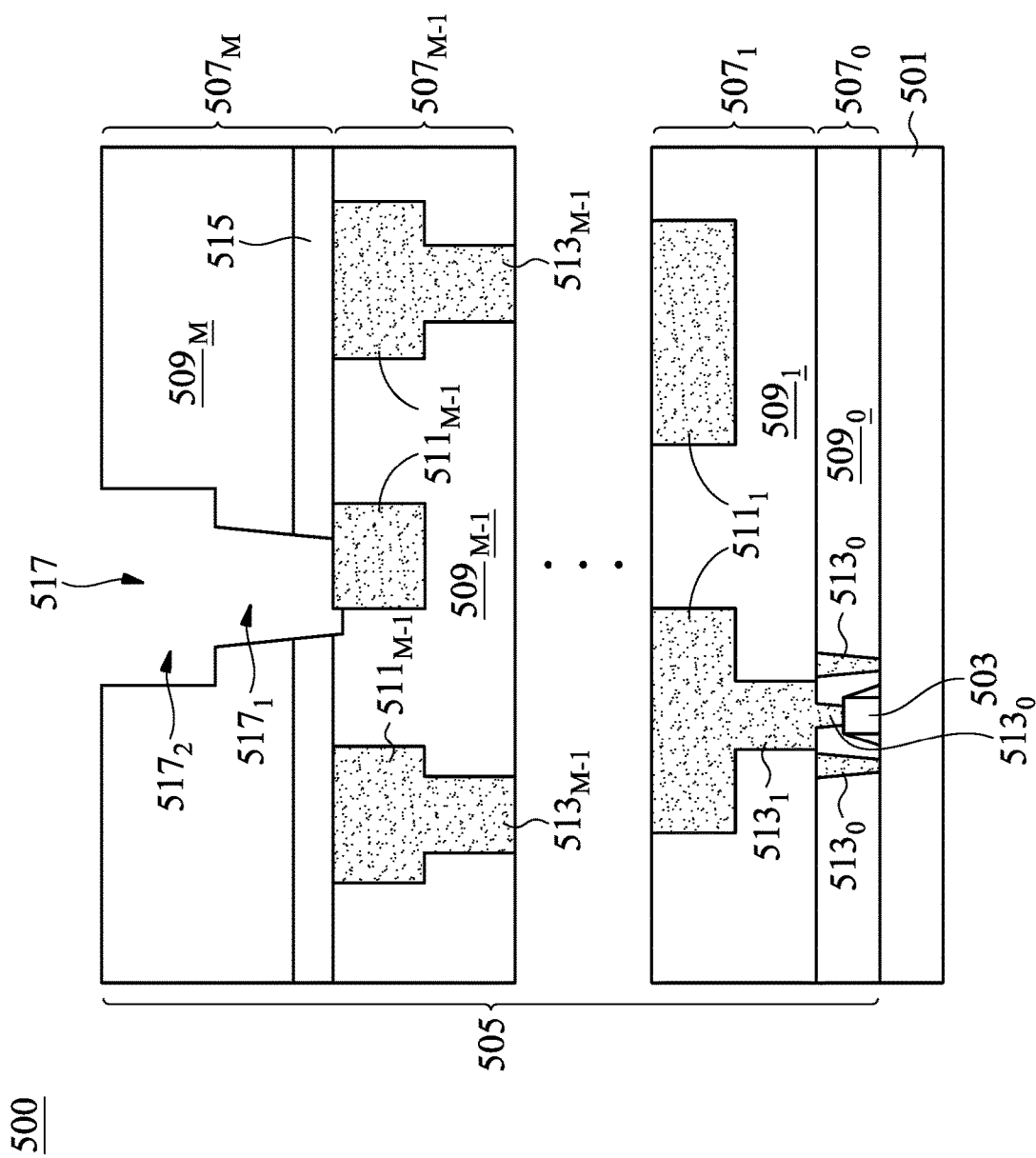
FIGS. 5A-5C illustrate cross-sectional views of various intermediate stages of fabrication of a semiconductor structure in accordance with some embodiments.
Figure 5B:
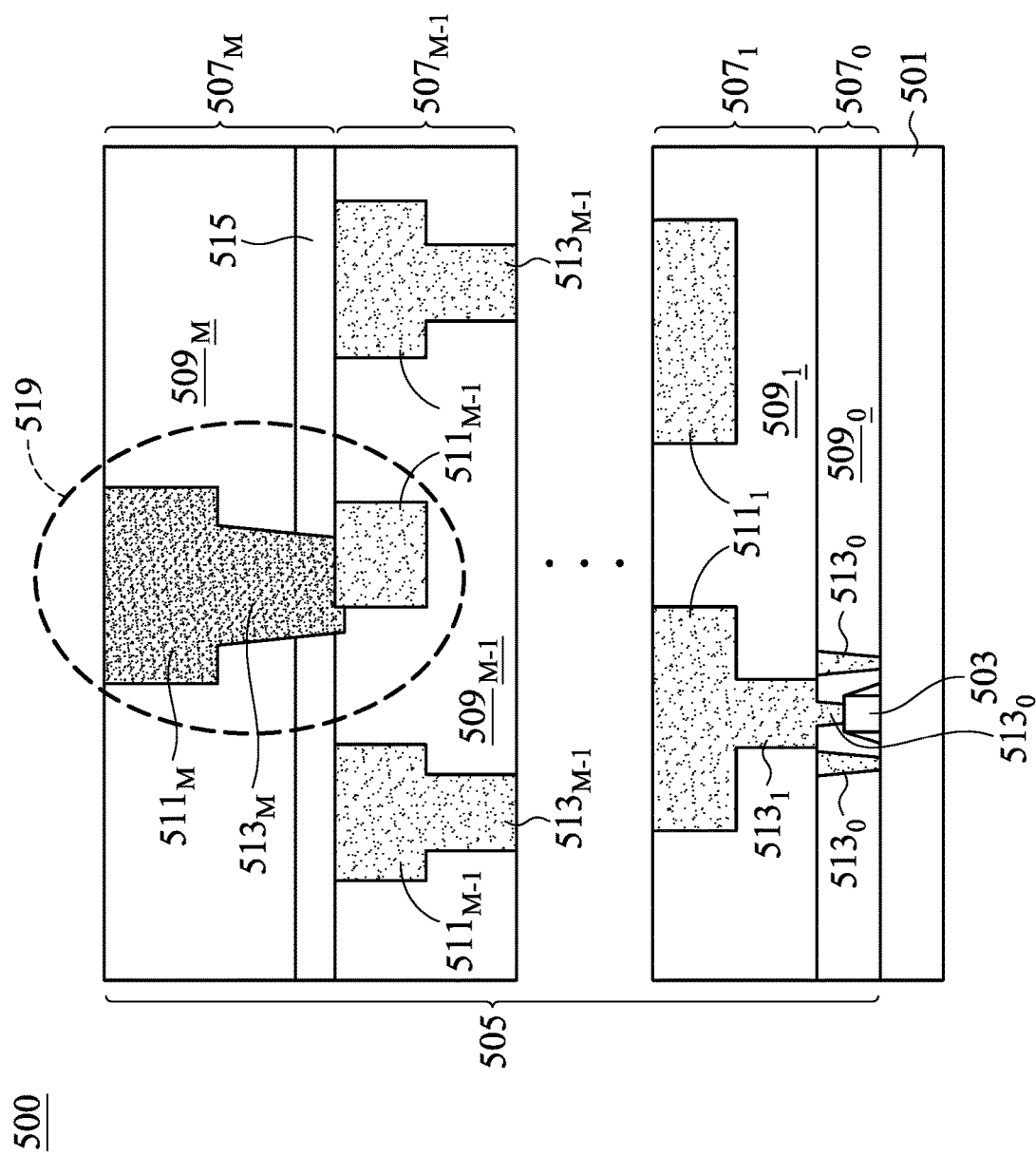
Figure 5C:
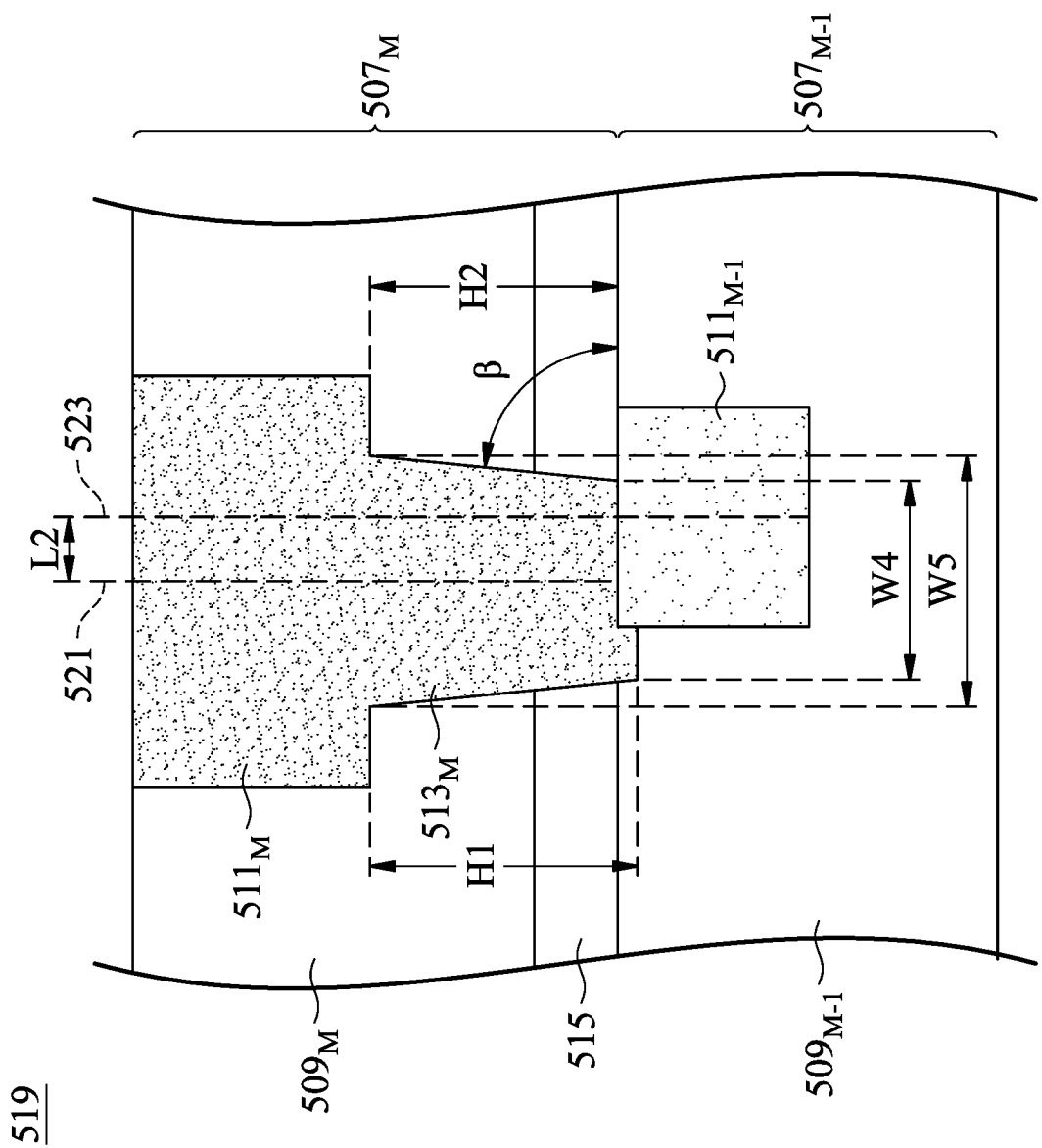

FIGS. 5A-5C illustrate cross-sectional views of various intermediate stages of fabrication of a semiconductor structure in accordance with some embodiments. Referring to FIG. 5A, a portion of a wafer 500 is illustrated. The wafer 500 may be an intermediate structure of an integrated circuit manufacturing process. In some embodiments, the wafer 500 may comprise a substrate 501. The substrate 501 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 501 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 503 are formed on the substrate 501. The one or more active and/or passive devices 503 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also used as appropriate for a given application.

In some embodiments, an interconnect structure 505 is formed over the one or more active and/or passive devices 503 and the substrate 501. The interconnect structure 505 electrically interconnects the one or more active and/or passive devices 503 to form functional electrical circuits within the wafer 500. The interconnect structure 505 may comprise one or more metallization layers $507_0$ to $507_M$, where M+1 is the number of the one or more metallization layers $507_0$ to $507_M$. In some embodiments, the value of M may vary according to design specifications of a resulting semiconductor structure.

The one or more metallization layers $507_0$ to $507_M$ comprise one or more dielectric layers $509_0$ to $509_M$, respectively. In some embodiments, the dielectric layer $509_0$ is an inter-layer dielectric (ILD) layer, and the dielectric layers $509_1$ to $509_M$ are inter-metal dielectric (IMD) layers. The ILD layer and the IMD layers may include low-k dielectric materials having k values, for example, lower than about 4.0 or even 2.0 disposed between such conductive features. In some embodiments, the ILD layer and IMD layers may be made of, for example, phosphosilicate glass (PSG), boro-phosphosilicate glass (BPSG), fluorosilicate glass (FSG), SiOxCy, Spin-On-Glass, Spin-On-Polymers, silicon carbon material, compounds thereof, composites thereof, combinations thereof, or the like, formed by any suitable method, such as spin-on coating, chemical vapor deposition (CVD), plasma-enhanced CVD (PECVD), or the like.

In some embodiments, etch stop layers (not shown) may be formed between adjacent ones of the dielectric layers $509_0$ to $509_M$. In the illustrated embodiment, such an etch stop layer (ESL) 515 is formed between the dielectric layers $509_{M-1}$ and $509_M$. The etch stop layers aid in patterning the dielectric layers $509_0$ to $509_M$ to form openings in the dielectric layers $509_0$ to $509_M$. A material for the etch stop layers is chosen such that etch rates of the etch stop layers are less then etch rates of corresponding ones of the dielectric layers $509_0$ to $509_M$. In an embodiment, an etch rate of the ESL 515 is less than an etch rate of the dielectric layer $509_M$. In some embodiments, the ESL 515 may comprise one or more layers of dielectric materials. Suitable dielectric materials may include oxides (such as silicon oxide, aluminum oxide, or the like), nitrides (such as SiN, or the like), oxynitrides (such as SiON, or the like), oxycarbides (such as SiOC, or the like), carbonitrides (such as SiCN, or the like), combinations thereof, or the like, and may be formed using spin-on coating, CVD, PECVD, atomic layer deposition (ALD), a combination thereof, or the like.

In some embodiments, the metallization layer $507_0$ further comprises conductive plugs $513_0$ within the dielectric layer $509_0$, and the metallization layers $507_1$ to $507_{M-1}$ further comprise one or more conductive interconnects, such as conductive lines $511_1$ to $511_{M-1}$ and conductive vias $513_1$ to $513_{M-1}$, within the dielectric layers $509_1$ to $509_{M-1}$, respectively. The conductive plugs $513_0$ electrically couple the one or more active and/or passive devices 503 to the conductive lines $511_1$ to $511_{M-1}$ and the conductive vias $513_1$ to $513_{M-1}$. As described below in greater detail, a conductive line $511_M$ and a conductive via $513_M$ (see FIGS. 5B and 5C) are formed within the dielectric layer $509_M$.

In some embodiments, the conductive plugs $513_0$, the conductive lines $511_1$ to $511_{M-1}$ and the conductive vias $513_1$ to $513_{M-1}$ may be formed using any suitable method, such as a damascene method, a dual damascene method, or the like. The conductive plugs $513_0$, the conductive lines $511_1$ to $511_{M-1}$ and the conductive vias $513_1$ to $513_{M-1}$ may comprise conductive materials such as copper, aluminum, tungsten, combinations thereof, or the like. The conductive plugs $513_0$, the conductive lines $511_1$ to $511_{M-1}$ and the conductive vias $513_1$ to $513_{M-1}$ may further comprise one or more barrier/adhesion layers (not shown) to protect the respective dielectric layers $509_0$ to $509_{M-1}$ from diffusion and metallic poisoning. The one or more barrier/adhesion layers may comprise titanium, titanium nitride, tantalum, tantalum nitride, or the like, and may be formed using physical vapor deposition (PVD), CVD, ALD, or the like. In an embodiment, the steps for forming the conductive plugs $513_0$, the conductive lines $511_1$ to $511_{M-1}$ and the conductive vias $513_1$ to $513_{M-1}$ may include forming openings in the respective dielectric layers $509_0$ to $509_{M-1}$, depositing barrier/adhesion layers in the openings, depositing seed layers of a suitable conductive material over barrier/adhesion layers, and filling the openings with a suitable conductive material, for example, by plating, or other suitable methods. A chemical mechanical polishing (CMP) is then performed to remove excess materials overfilling the openings.

Referring further to FIG. 5A, the dielectric layer $509_M$ is patterned to form an opening 517 in the dielectric layer $509_M$. In some embodiments, the dielectric layer $509_M$ may be patterned using a suitable etching process, such as an anisotropic dry etching process. In some embodiments, the wafer 500 may be introduced into a chamber of an etching system (such as the chamber 101 of the etching system 100 described above with reference to FIG. 1) for further processing. In some embodiments, the wafer 500 may be placed and secured on a chuck, such as the chuck 107 described above with reference to FIG. 1. In some embodiments, a direction of ions of plasma used for etching the wafer 500 is adjusted such that the direction of ions is substantially perpendicular to an etched surface of the wafer 500 (or a top surface of the dielectric layer $509_M$). In some embodiments, the direction of ions is adjusted such that the direction of ions forms an angle with the etched surface of the wafer 500, which is within the desired range around 90 degrees. In some embodiments, the direction of ions may be adjusted by adjusting a vertical position of a focus ring (such as the focus ring 113 described above with reference to FIG. 1) as described above with reference to FIGS. 1, 2, 3A, 3B, and 4. By forming the opening 517 in this manner, the overlay shift between the opening 517 (and subsequently formed conductive line $511_M$ and conductive via $513_M$ in the opening 517) and the underlying conductive line $511_{M-1}$ may be reduced or eliminated. In some embodiments, due to the overlay shift between the opening 517 and the underlying conductive line $511_{M-1}$, a portion of the opening 517 may extend into the dielectric layer $509_{M-1}$ below a top surface of the underlying conductive line $511_{M-1}$.

In some embodiments, the opening 517 may comprise a lower portion $517_1$ and an upper portion $517_2$. The lower portion $517_1$ may be also referred to as a via opening $517_1$. The upper portion $517_2$ may be also referred to as a line opening/trench $517_2$. In some embodiments, the opening 517 may be formed using a via-first process or a trench-first process. In some embodiments where the via-first process is used, the lower portion $517_1$ is formed before the upper portion $517_2$. In some embodiments where the trench-first process is used, the upper portion $517_2$ is formed before the lower portion $517_1$.

Referring to FIG. 5B, the opening 517 (see FIG. 5A) is filled with suitable conductive materials to form the conductive line $511_M$ and the conductive via $513_M$. The suitable conductive materials may include copper, aluminum, tungsten, combinations thereof, alloys thereof, or the like. The conductive line $511_M$ and the conductive via $513_M$ may further comprise one or more barrier/adhesion layers (not shown) to protect the dielectric layer $509_M$ from diffusion and metallic poisoning. The one or more barrier/adhesion layers may comprise titanium, titanium nitride, tantalum, tantalum nitride, or the like, and may be formed using PVD, CVD, ALD, or the like. In some embodiments, the steps for forming the conductive line $511_M$ and the conductive via $513_M$ may include depositing one or more barrier/adhesion layers on sidewalls and bottoms of the opening 517, depositing a seed layer of a suitable conductive material over the one or more barrier/adhesion layers, and filling the opening 517 with a suitable conductive material, for example, by plating, or other suitable methods. Subsequently, excess materials overfilling the opening 517 are removed to expose a top surface of the dielectric layer $509_M$. In some embodiments, the excess materials may be removed using a CMP process, a grinding process, an etching process, the like, or a combination thereof.

In some embodiments, the metallization layer $507_M$ may be the last metallization layer of the interconnect structure 505 and formation of the metallization layer $507_M$ completes formation of the interconnect structure 505. In other embodiments, the metallization layer $507_M$ may be an intermediate metallization layer of the interconnect structure 505. In such embodiments, additional metallization layers are formed over the metallization layer $507_M$ until the formation of the interconnect structure 505 is completed. In some embodiments, further processing steps may be performed on the wafer 500 after the formation of the interconnect structure 505 is completed. The further processing steps may include formation of contact pads and one or more passivation layers over the interconnect structure 505, formation of under-bump metallizations (UBMs) over the contact pads, and formation of connectors over the UBMs. Subsequently, the wafer 500 may be singulated into separate dies, which may further undergo various packaging processes.

FIG. 5C illustrates a portion 519 of the wafer 500 shown in FIG. 5B in accordance with some embodiments. In some embodiments, an axis 521 of the conductive via $513_M$ may be spaced apart from an axis 523 of the underlying conductive line $511_{M-1}$ by a distance L2 due to the overlay shift between the conductive via $513_M$ and the underlying conductive line $511_{M-1}$. In some embodiments, the distance L2 may be between about 3 nm and about 8 nm. Due to the overlay shift between the conductive via $513_M$ and the underlying conductive line $511_{M-1}$, the conductive via $513_M$ may have a non-uniform height. In some embodiments, the conductive via $513_M$ may have a height H1 directly over the dielectric layer $509_{M-1}$, and have a height H2 directly over the conductive line $511_{M-1}$. In some embodiments, the height H1 may be between about 450 Å and about 480 Å. In some embodiments, the height H2 may be between about 450 Å and about 480 Å. In some embodiments, a ratio H1/H2 may be between about 0.93 and about 1.07. In some embodiments, a bottom portion of the conductive via $513_M$ has a width W4 and a top portion of the conductive via $513_M$ has a width W5. In some embodiments, the width W4 is between about 230 Å and about 250 Å. In some embodiments, the width W5 is between about 250 Å and about 300 Å. In some embodiments, a ratio W5/W4 may be between about 2.8 and about 3.0. In some embodiments, a sidewall of the conductive via $513_M$ and a top surface of the underlying conductive line $511_{M-1}$ form an angle β. In some embodiments, the angle β may be between about 66 degrees and about 69 degrees.

Figure 6A:
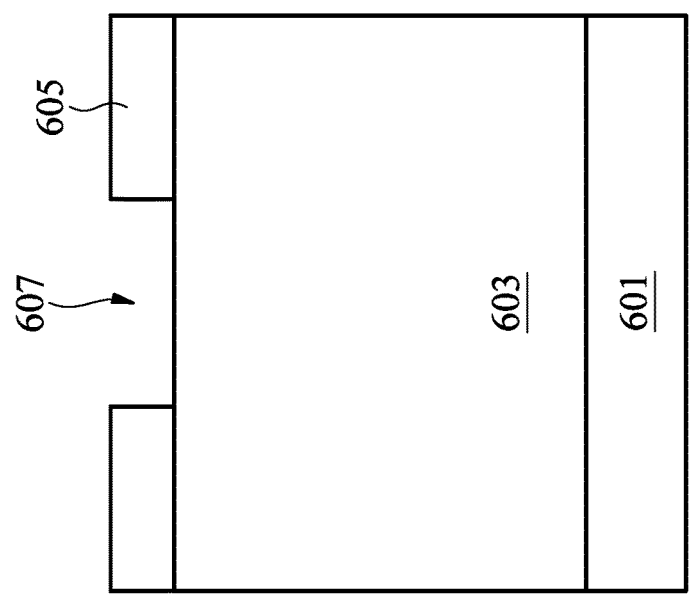
FIGS. 6A-6D illustrate cross-sectional views of various intermediate stages of fabrication of a semiconductor structure in accordance with some embodiments.

FIGS. 6A-6D illustrate cross-sectional views of various intermediate stages of fabrication of a semiconductor structure in accordance with some embodiments. Referring to FIG. 6A, a portion of a wafer 600 is illustrated. The wafer 600 may be an intermediate structure of an integrated circuit manufacturing process. In some embodiments, the wafer 600 may comprise a base layer 601, a target layer 603 over the base layer 601, and a mask 605 over the target layer 603. The base layer 601 may comprise a substrate. In some embodiments, the substrate of the base layer may be formed using similar materials and methods as the substrate 501 described above with reference to FIG. 5A and the description is not repeated herein. In some embodiments, the base layer 601 may comprise a lower portion of the substrate and the target layer 603 may be an upper portion of the substrate. In such embodiments, upper portion of the substrate may be patterned to form, for example, openings for isolation structures.

In some embodiments, the base layer 601 may further comprise one or more active and/or passive devices that are formed on the substrate. In some embodiments, the one or more active and/or passive devices of the base layer 601 may be similar to the one or more active and/or passive devices 503 described above with reference to FIG. 5A and the description is not repeated herein. In some embodiments, the base layer 601 may further comprise an interconnect structure formed over the one or more active and/or passive devices and the substrate. In some embodiments, the interconnect structure of the base layer 601 may be formed using similar materials and methods as the interconnect structure 505 described above with reference to FIG. 5A and the description is not repeated herein. In some embodiments, the target layer 603 may be an ILD layer of the interconnect structure. In such embodiments, the target layer 603 may be patterned to form openings for conductive contacts, which provide electrical connection to the one or more active and/or passive devices. In other embodiments, the target layer 603 may be an IMD layer of the interconnect structure. In such embodiments, the target layer 603 may be pattered to form openings for conductive features (such as conductive lines and vias) of a respective metallization layer of the interconnect structure.

The mask 605 may be a hard mask layer comprising one or more layers of silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like. In some embodiments, the mask 605 is patterned to form an opening 607 in the mask 605. In some embodiments, mask 605 may be patterned using acceptable photolithography and etching techniques to form the opening 607.

Figure 6B:
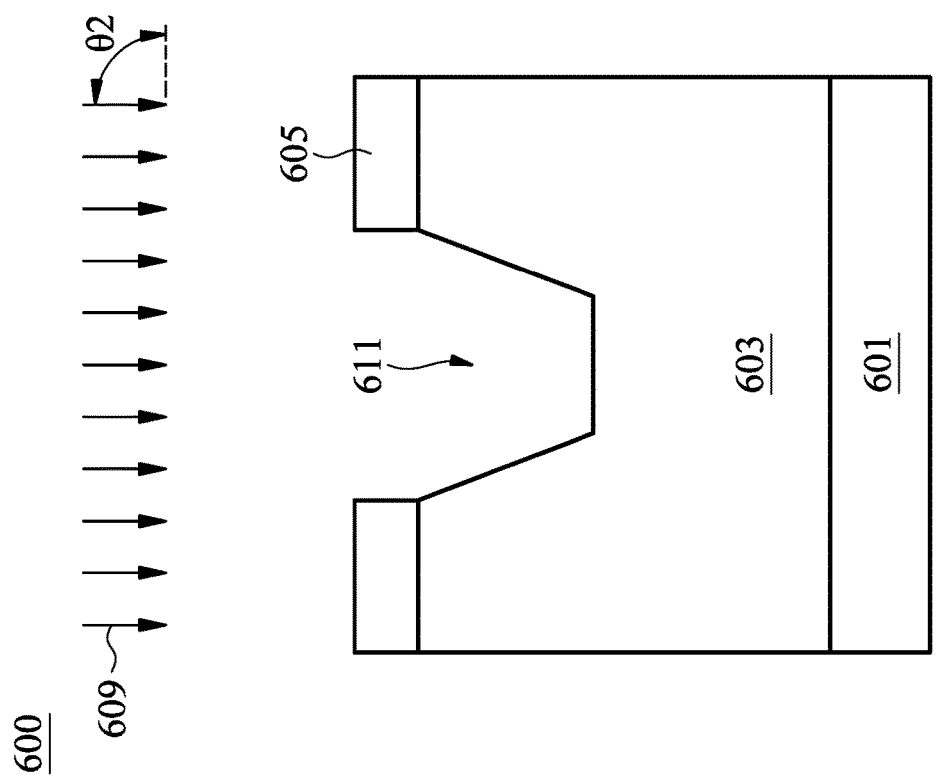

Referring to FIG. 6B, the wafer 600 is introduced into a chamber of an etching system (such as the chamber 101 of the etching system 100 described above with reference to FIG. 1) for further processing. In some embodiments, the wafer 600 may be placed and secured on a chuck within the chamber (such as the chuck 107 described above with reference to FIG. 1). In some embodiments, the target layer 603 is etched using the mask 605 as an etch mask. In some embodiments, a direction of ions (illustrated by arrows 609) of plasma used for etching the wafer 500 is adjusted such that the direction of ions (illustrated by arrows 609) forms an angle θ2 with and an etched surface of the wafer 500 (or a top surface of the target layer 603). Accordingly, an etching direction of the etching process is adjusted. In some embodiments, the angle θ2 may be about 90 degrees. In some embodiments, the direction of ions (illustrated by arrows 609) may be adjusted by adjusting a vertical position of a focus ring (such as the focus ring 113 illustrated in FIG. 1) as described above with reference to FIGS. 1, 2, 3A, 3B, and 4, and the description is not repeated herein. In some embodiments, after adjusting the direction of ions, the target layer 603 is etched for a first time interval to form an opening 611 in the target layer 603.

Figure 6C:
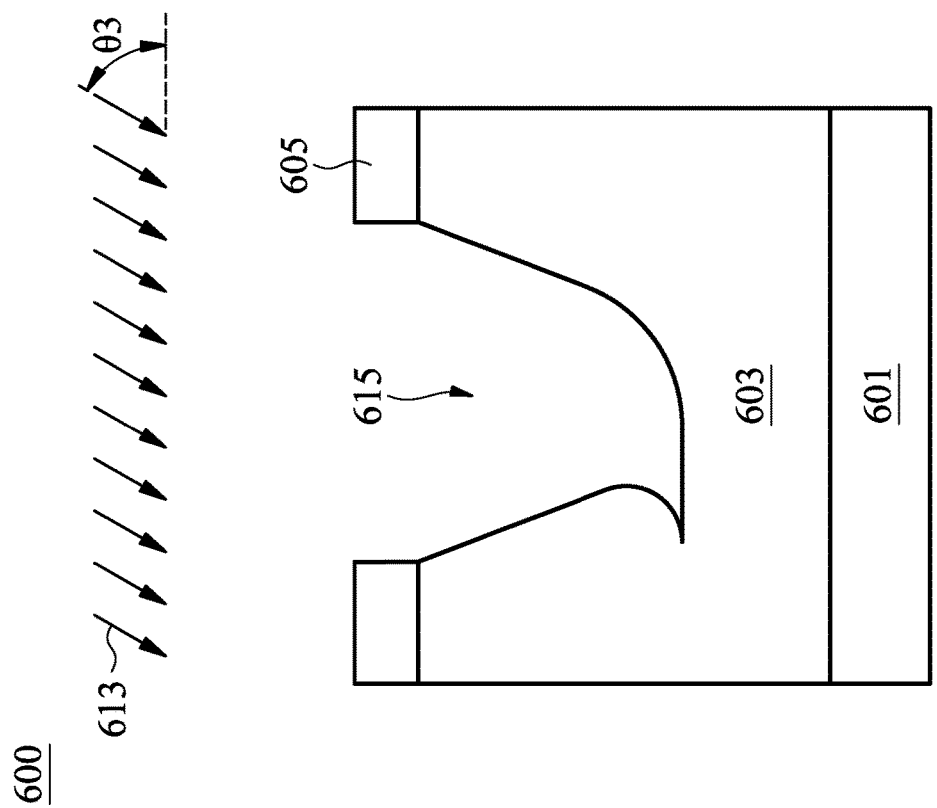

Referring to FIG. 6C, after forming the opening 611 (see FIG. 6B) in the target layer 603, the direction of ions (illustrated by arrows 613) is adjusted such that the direction of ions (illustrated by arrows 613) forms an angle θ3 with the etched surface of the wafer 500 (or the top surface of the target layer 603). Accordingly, an etching direction of the etching process is adjusted. In some embodiments, the angle θ3 may be different from the angle θ2. In some embodiments, the angle θ3 may be less than about 90 degrees. In some embodiments, the direction of ions may be adjusted by adjusting the vertical position of the focus ring (such as the focus ring 113 illustrated in FIG. 1) as described above with reference to FIGS. 1, 2, 3A, 3B, and 4, and the description is not repeated herein. In some embodiments, after adjusting the direction of ions, the target layer 603 is etched for a second time interval to reshape the opening 611 (see FIG. 6B) and form an opening 615 in the target layer 603. In some embodiments, the second time interval may be different from the first time interval. In other embodiments, the second time interval may be substantially same as the first time interval.

Figure 6D:
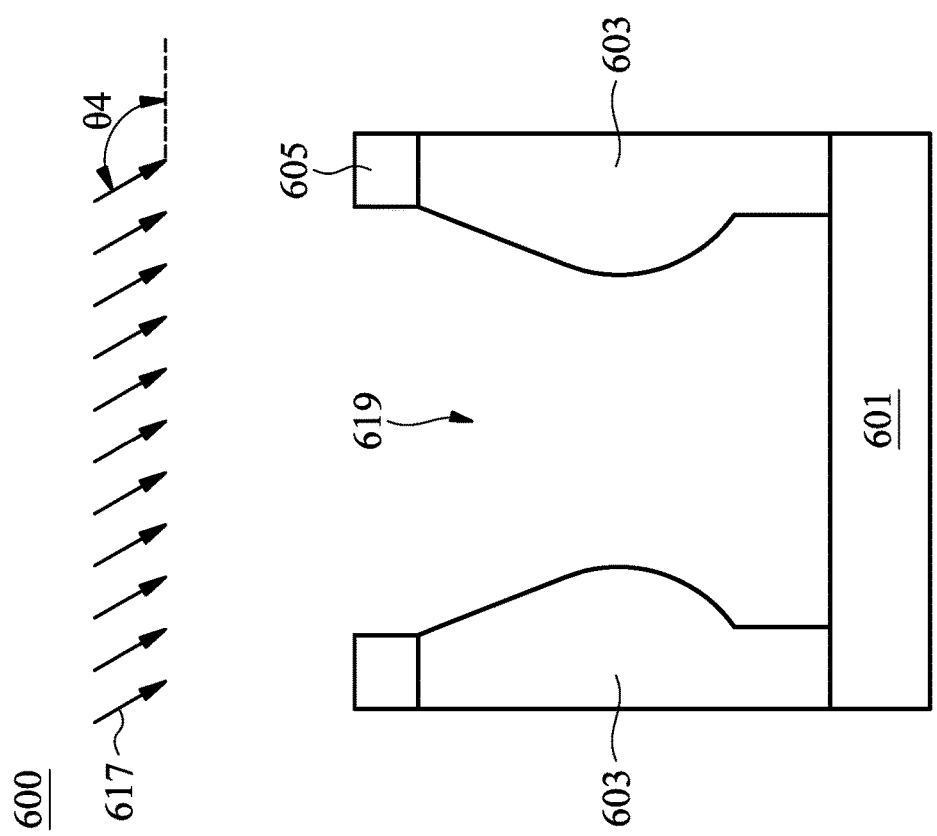

Referring to FIG. 6D, after forming the opening 615 (see FIG. 6C) in the target layer 603, the direction of ions (illustrated by arrows 617) is adjusted such that the direction of ions (illustrated by arrows 617) forms an angle θ4 with the etched surface of the wafer 600 (or the top surface of the target layer 603). Accordingly, an etching direction of the etching process is adjusted. In some embodiments, the angle θ4 may be different from the angles θ2 and θ3. In some embodiments, the angle θ4 may be greater than about 90 degrees. In some embodiments, the direction of ions may be adjusted by adjusting the vertical position of the focus ring (such as the focus ring 113 illustrated in FIG. 1) as described above with reference to FIGS. 1, 2, 3A, 3B, and 4, and the description is not repeated herein. In some embodiments, after adjusting the direction of ions, the target layer 603 is etched for a third time interval to reshape the opening 615 (see FIG. 6C) and form an opening 619 in the target layer 603. In some embodiments, the third time interval may be different from the first time interval and the second time interval. In other embodiments, the third time interval may be substantially same as the first time interval and the second time interval. By dynamically adjusting the direction of ions during the etching process as described above, the opening 615 having a desired profile and desired dimensions is formed.

After forming the opening 619 in the target layer 603, further process steps may be performed on the wafer 600. In some embodiments, the opening 619 may be filled with a suitable material. In some embodiments where the target layer 603 is an upper portion of the substrate, the opening 619 may be filled with a suitable dielectric material to form an isolation region in the opening 619. In some embodiments where the target layer 603 is an ILD layer or an IMD layer, the opening 619 may be filled with a suitable conductive material to form a conductive feature in the opening 619.

Figure 7A:
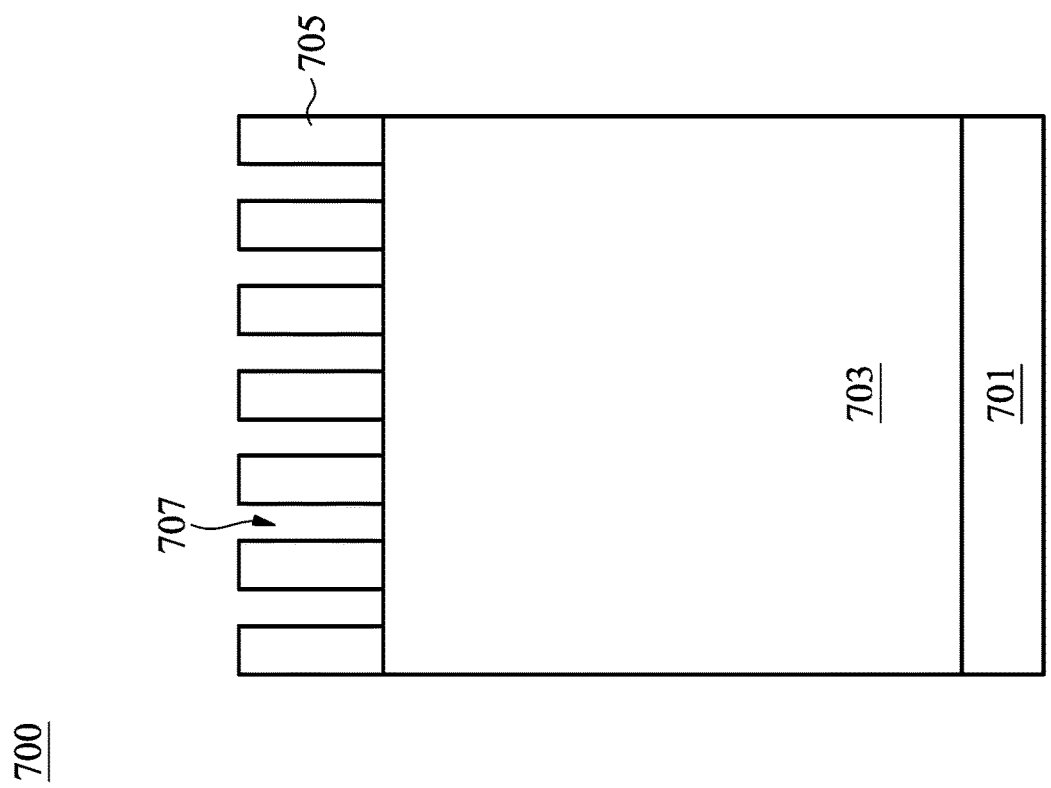
FIGS. 7A-7C illustrate cross-sectional views of various intermediate stages of fabrication of a semiconductor structure in accordance with some embodiments.
Figure 7B:
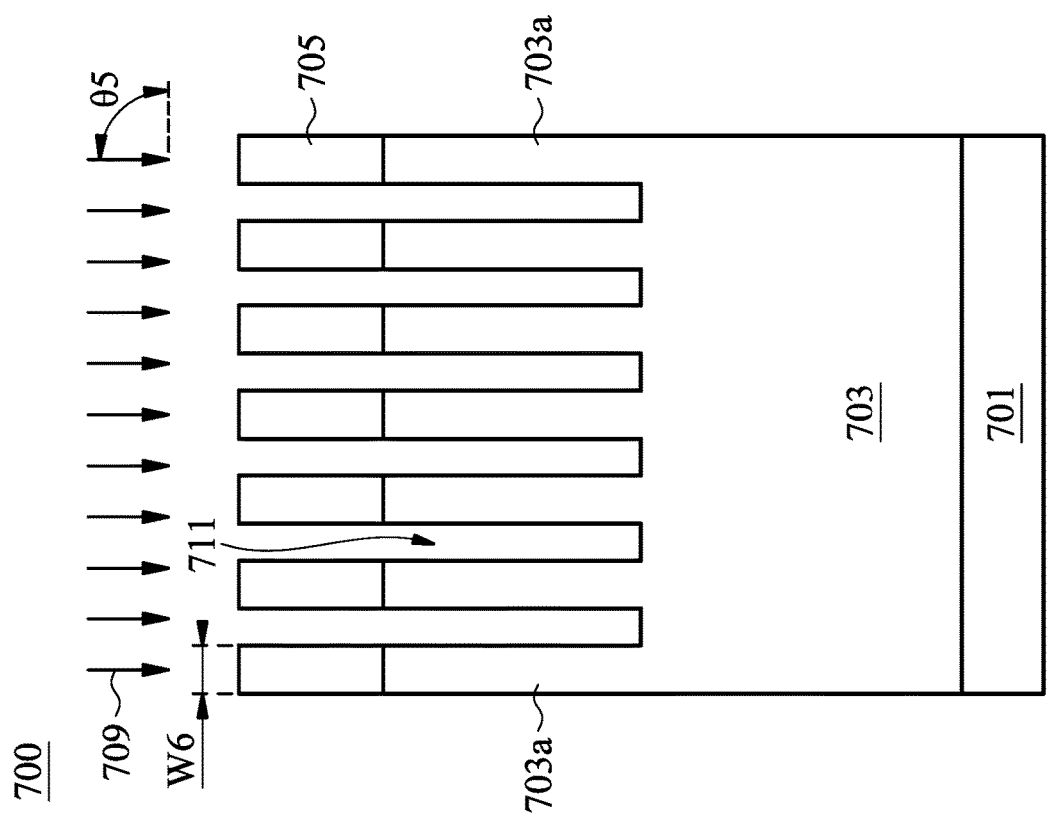
Figure 7C:
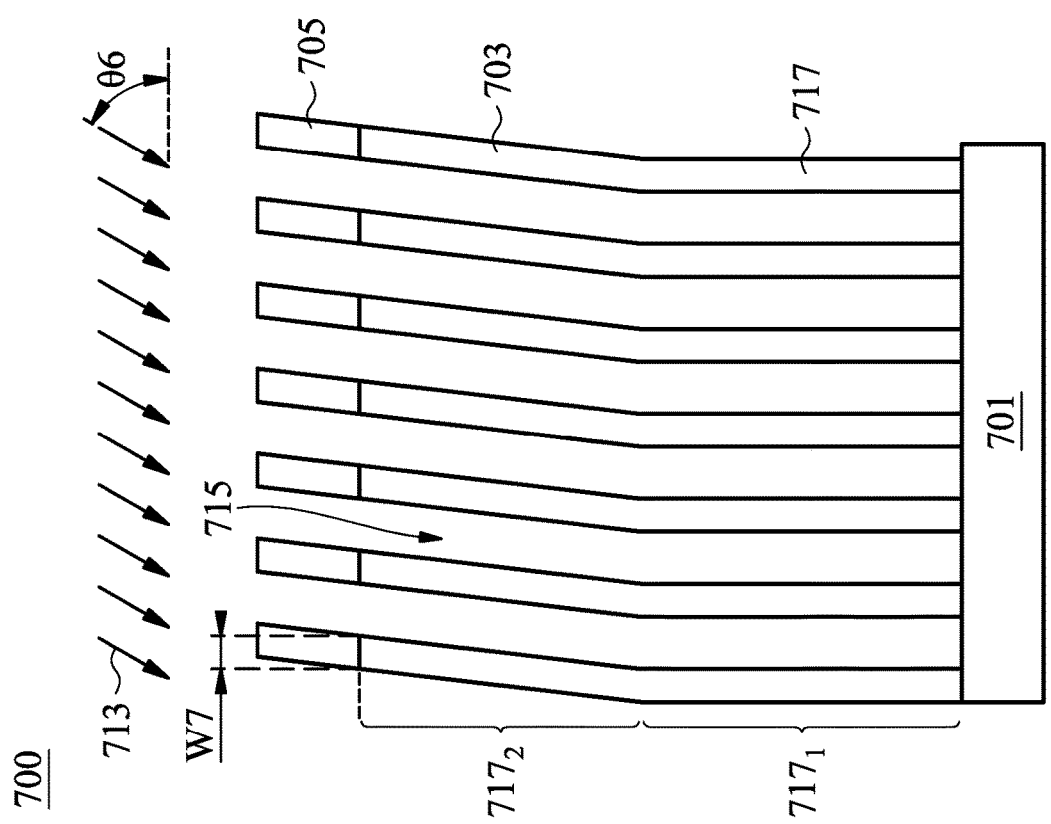

FIGS. 7A-7C illustrate cross-sectional views of various intermediate stages of fabrication of a semiconductor structure in accordance with some embodiments. Referring to FIG. 7A, a portion of a wafer 700 is illustrated. The wafer 700 may be an intermediate structure of an integrated circuit manufacturing process. In some embodiments, the wafer 700 may comprise a base layer 701, a target layer 703 over the base layer 701, and a mask 705 over the target layer 703. In some embodiments, the base layer 701, the target layer 703, and the mask 705 may be formed using similar materials and methods as the base layer 601, the target layer 603, and the mask 605 described above with reference to FIG. 6A and the description is not repeated herein. In some embodiments, the mask 705 is patterned to form a plurality of openings 707 in the mask 705. In some embodiments, the mask 705 may be patterned using acceptable photolithography and etching techniques to form the openings 707. In some embodiments, the target layer 703 may comprise a conductive material such as, for example, polysilicon. In such embodiments, the target layer 703 may be patterned to from a plurality of gate structures as described below in greater detail (see FIGS. 7B and 7C).

Referring to FIG. 7B, the wafer 700 is introduced into a chamber of an etching system (such as the chamber 101 of the etching system 100 described above with reference to FIG. 1) for further processing. In some embodiments, the wafer 700 may be placed and secured on a chuck within the chamber (such as the chuck 107 described above with reference to FIG. 1). In some embodiments, the target layer 703 is etched using the mask 705 as an etch mask. In some embodiments, a direction of ions (illustrated by arrows 709) of plasma used for etching the wafer 700 is adjusted such that the direction of ions (illustrated by arrows 709) forms an angle θ5 with an etched surface of the wafer 700 (or a top surface of the target layer 703). Accordingly, an etching direction of the etching process is adjusted. In some embodiments, the angle θ5 may be about 90 degrees. In some embodiments, the direction of ions may be adjusted by adjusting a vertical position of a focus ring (such as the focus ring 113 illustrated in FIG. 1) as described above with reference to FIGS. 1, 2, 3A, 3B, and 4, and the description is not repeated herein. In some embodiments, after adjusting the direction of ions, the target layer 703 is etched for a first time interval to form a plurality of openings 711 in the target layer 703, which are interposed between un-etched portions 703a of the target layer 703. The un-etched portions 703a of the target layer 703 have a width W6.

Referring to FIG. 7C, after forming the openings 711 (see FIG. 7B) in the target layer 703, the direction of ions (illustrated by arrows 713) is adjusted such that the direction of ions (illustrated by arrows 713) forms an angle θ6 with the etched surface of the wafer 700 (or the top surface of the target layer 703). Accordingly, an etching direction of the etching process is adjusted. In some embodiments, the angle θ6 may be different from the angle θ5. In some embodiments, the angle θ6 may be less than about 90 degrees. In other embodiments, the angle θ6 may be greater than about 90 degrees. In some embodiments, the direction of ions may be adjusted by adjusting the vertical position of the focus ring (such as the focus ring 113 illustrated in FIG. 1) as described above with reference to FIGS. 1, 2, 3A, 3B, and 4, and the description is not repeated herein. In some embodiments, after adjusting the direction of ions, the target layer 703 is etched for a second time interval to reshape the openings 711 (see FIG. 7B) and form a plurality of openings 715 in the target layer 703. In some embodiments, the second time interval may be different from the first time interval. In other embodiments, the second time interval may be substantially same as the first time interval. In some embodiments, a width of the openings 715 is greater than a width of the openings 711 (see FIG. 7B).

Referring further to FIG. 7C, in some embodiments where the target layer 703 is formed of a conductive material, portions of the target layer 703 interposed between adjacent openings 715 form a plurality of gate structures 717. In the illustrated embodiments, lower portions $717_1$ of the gate structures 717 have substantially vertical sidewalls and upper portions $717_2$ of the gate structures 717 have non-vertical sidewalls. By dynamically adjusting the direction of ions during the etching process as described above, the gate structures 717 may be formed to have desired profiles and dimensions. In some embodiments, a width W7 of gate structures 717 is less than the width W6 of the un-etched portions 703a of the target layer 703 (see FIG. 7B).

Figure 8:
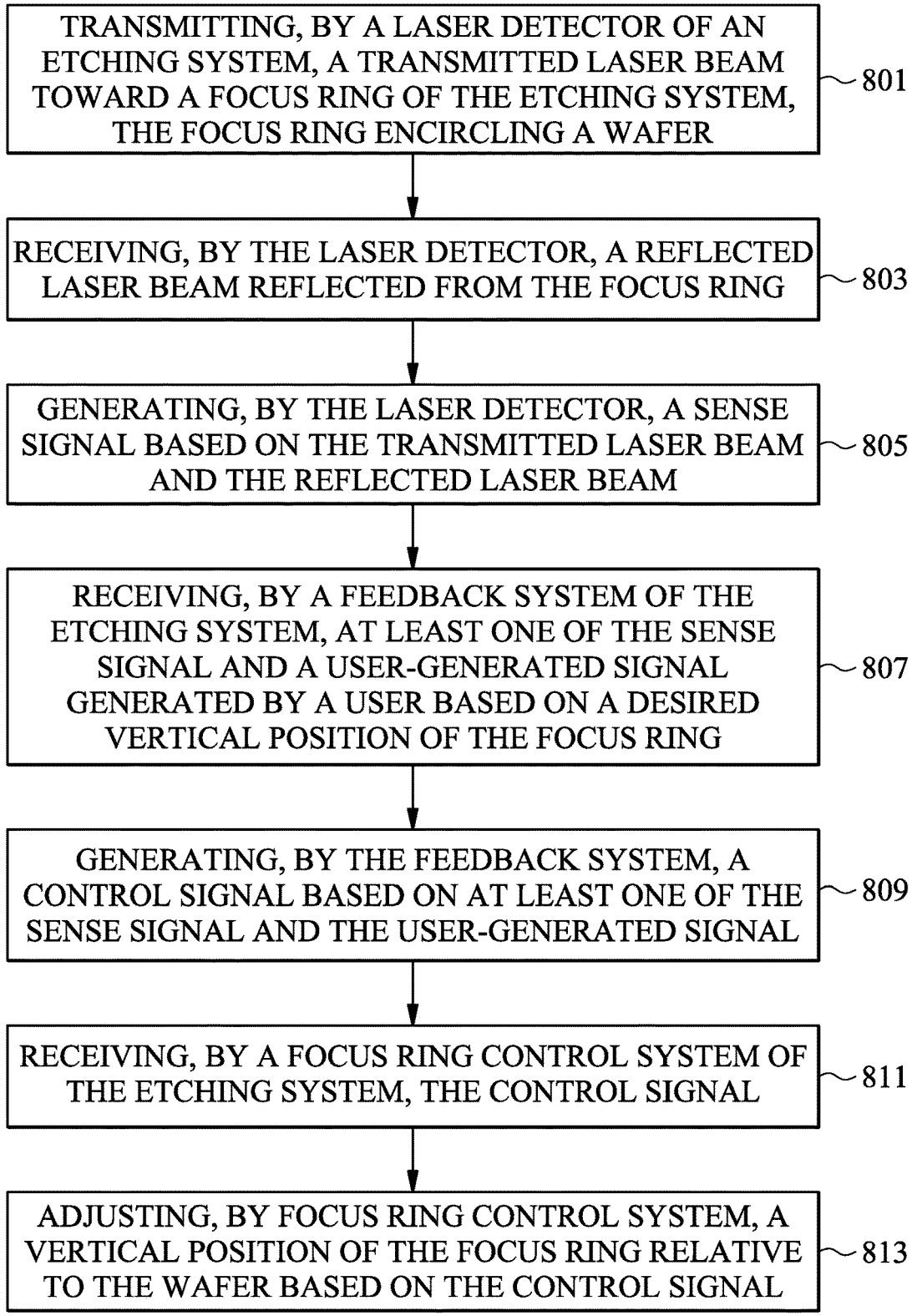
FIG. 8 is a flow diagram illustrating a method of operating an etching system in accordance with some embodiments.

FIG. 8 is a flow diagram illustrating a method 800 of operating an etching system in accordance with some embodiments. The method 800 starts with step 801, where a laser detector (such as the laser detector 125 illustrated in FIGS. 1 and 2) of an etching system (such as the etching system 100 illustrated in FIG. 1) transmits a transmitted laser beam (such as the transmitted laser beam 203 illustrated in FIG. 2) toward a focus ring (such as the focus ring 113 illustrated in FIGS. 1 and 2) encircling a wafer (such as the wafer 111 illustrated in FIG. 1) as described above with reference to FIGS. 1 and 2. In step 803, the laser detector receives a reflected laser beam (such as the reflected laser beam 205 illustrated in FIG. 2) reflected from the focus ring as described above with reference to FIGS. 1 and 2. In step 805, the laser detector generates a sense signal (such as the sense signal 207 illustrated in FIG. 2) based on the transmitted laser beam and the reflected laser beam as described above with reference to FIGS. 1 and 2. In step 807, a feedback system (such as the feedback system 201 illustrated in FIG. 2) of the etching system receives at least one of the sense signal and a user-generated signal (such as the user-generated signal 213 illustrated in FIG. 2) generated by a user based on a desired vertical position of the focus ring as described above with reference to FIGS. 1 and 2. In step 809, the feedback system generates a control signal based on at least one of the sense signal and the user-generated signal as described above with reference to FIGS. 1 and 2. In step 811, a focus ring control system (such as the focus ring control system 117 illustrated in FIGS. 1 and 2) of the etching system receives the control signal as described above with reference to FIGS. 1 and 2. In step 813, the focus ring control system adjusts a vertical position of the focus ring relative to the wafer based on the control signal as described above with reference to FIGS. 1 and 2.

Figure 9:
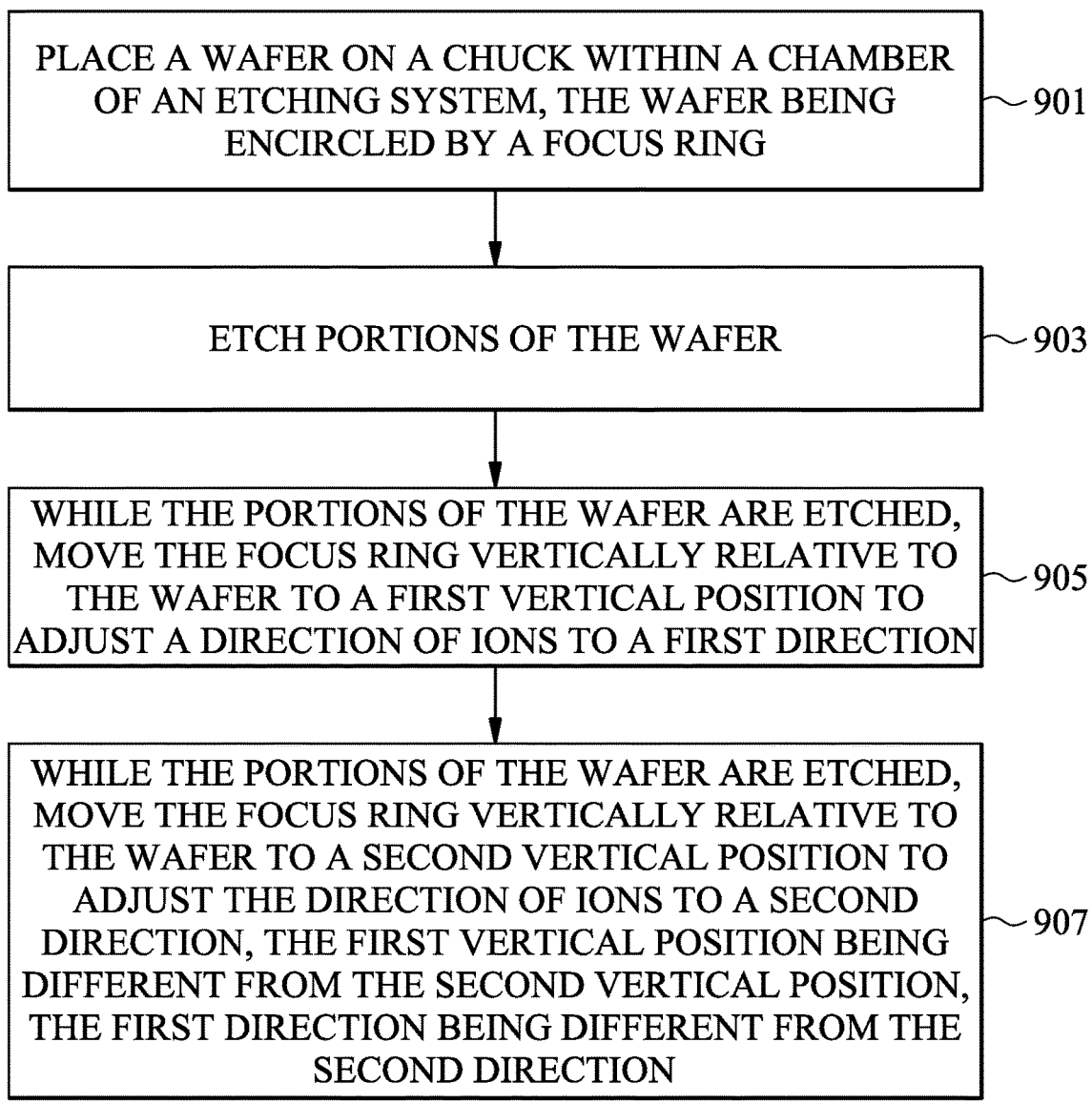
FIG. 9 is a flow diagram illustrating a method of forming a semiconductor structure in accordance with some embodiments.

FIG. 9 is a flow diagram illustrating a method 900 of forming a semiconductor structure in accordance with some embodiments. The method 900 starts with step 901, where a wafer (such as the wafer 600 illustrated in FIG. 6A) is placed on a chuck (such as the chuck 107 illustrated in FIG. 1) within a chamber (such as the chamber 101 illustrated in FIG. 1) of an etching system (such as the etching system 100 illustrated in FIG. 1) as described above with reference to FIG. 6B. In some embodiments, the wafer is encircled by a focus ring (such as the focus ring 113 illustrated in FIG. 1). In step 903, portions of the wafer are etched as described above with reference to FIGS. 6B-6D. In step 905, while the portions of the wafer are etched, the focus ring is moved vertically relative to the wafer to a first vertical position to adjust a direction of ions to a first direction (such as the direction 609 illustrated in FIG. 6B) as described above with reference to FIG. 6B. In step 907, while the portions of the wafer are etched, the focus ring is moved vertically relative to the wafer to a second vertical position to adjust the direction of ions to a second direction (such as the direction 613 illustrated in FIG. 6C) as described above with reference to FIG. 6C. In some embodiments, the first vertical position is different from the second vertical position. In some embodiments, the first direction is different from the second directions.

In accordance with an embodiment, a method includes: mounting a wafer on a chuck disposed within a chamber of an etching system, the wafer being encircled by a focus ring; while etching portions of the wafer, adjusting an etch direction to a first desired etch direction by adjusting a vertical position of the focus ring relative to the wafer to a first desired vertical position; and while etching portions of the wafer, adjusting the etch direction to a second desired etch direction by adjusting the vertical position of the focus ring relative to the wafer to a second desired vertical position, the second desired vertical position being different from the first desired vertical position, the second desired etch direction being different from the first desired etch direction. In an embodiment, adjusting the vertical position of the focus ring relative to the wafer to the first desired vertical position includes: detecting, by a detector of the etching system, a distance between the detector and the focus ring; generating, by the detector, a sense signal based on the distance; receiving, by a feedback system of the etching system, at least one of the sense signal and a user-generated signal generated by a user based on the first desired vertical position; generating, by the feedback system, a control signal based on at least one of the sense signal and the user-generated signal; and moving the focus ring to the first desired vertical position based on the control signal. In an embodiment, the detector is a laser detector, and detecting the distance between the detector and the focus ring includes: transmitting, by the laser detector, a transmitted laser beam toward the focus ring; and receiving, by the laser detector, a reflected laser beam reflected from the focus ring. In an embodiment, the detector is disposed within the chamber of the etching system. In an embodiment, adjusting the etch direction to the first desired etch direction includes adjusting a direction of ions to a first desired direction of ions. In an embodiment, adjusting the etch direction to the second desired etch direction includes adjusting the direction of ions to a second desired direction of ions, the second desired direction of ions being different from the first desired direction of ions. In an embodiment, the focus ring has a non-vertical inner sidewall.

In accordance with another embodiment, a method includes: placing a wafer on a chuck disposed within a chamber of an etching system, the chuck being encircled by a focus ring; while performing an etching process on the wafer, adjusting a direction of ions used during the etching processes to a first desired ion direction by adjusting a vertical position of the focus ring relative to the wafer to a first desired vertical position; and while performing the etching process on the wafer, adjusting the direction of ions used during the etching processes to a second desired ion direction by adjusting the vertical position of the focus ring relative to the wafer to a second desired vertical position, the second desired vertical position being different from the first desired vertical position, the second desired ion direction being different from the first desired ion direction. In an embodiment, adjusting the vertical position of the focus ring relative to the wafer to the first desired vertical position includes: detecting a detected vertical position of the focus ring; and moving the focus ring based on the detected vertical position and the first desired vertical position. In an embodiment, detecting the detected vertical position of the focus ring includes: transmitting, by a laser detector, a transmitted laser beam toward the focus ring; and receiving, by the laser detector, a reflected laser beam reflected from the focus ring. In an embodiment, the laser detector is disposed within the chamber of the etching system. In an embodiment, moving the focus ring based on the detected vertical position and the first desired vertical position includes: generating, by the laser detector, a sense signal based on the detected vertical position; receiving, by a feedback system, at least one of the sense signal and a user-generated signal generated by a user based on the first desired vertical position; generating, by the feedback system, a control signal based on at least one of the sense signal and the user-generated signal; and receiving, by a focus ring control system, the control signal. In an embodiment, the focus ring control system is an actuator disposed within the chamber of the etching system. In an embodiment, the feedback system is disposed within the chamber of the etching system.

In accordance with yet another embodiment, an etching apparatus includes: a chamber; a chuck disposed within the chamber, the chuck being configured to hold a wafer; a focus ring disposed within the chamber, the focus ring encircling the chuck, the focus ring being configured to control a direction of ions within the chamber; a detector disposed within the chamber, the detector being configured to detect a distance between the detector and the focus ring; a focus ring control system coupled to the focus ring, the focus ring control system being configured to move the focus ring in a direction perpendicular to a major surface of the chuck; and a feedback system coupled to the detector and the focus ring control system, the feedback system being configured to receive at least one of a sense signal from the detector and a user-generated signal from a user, and transmit a control signal to the focus ring control system. In an embodiment, the user-generated signal is based on a desired distance between the detector and the focus ring. In an embodiment, the detector is a laser detector. In an embodiment, the laser detector is configured to transmit a transmitted laser beam toward the focus ring and receive a reflected laser beam reflected from the focus ring. In an embodiment, the focus ring control system is an actuator. In an embodiment, the feedback system is disposed within the chamber.

In accordance with yet another embodiment, an etching apparatus includes: a chamber; a chuck disposed within the chamber, the chuck being configured to hold a wafer during an etching process performed on the wafer; a focus ring disposed within the chamber, the focus ring encircling the chuck, the focus ring being configured to control an etch direction of the etching process; and a focus ring control system coupled to the focus ring, the focus ring control system being configured to adjust a vertical position of the focus ring relative to the wafer.

In accordance with yet another embodiment, an etching apparatus includes: a chamber; a chuck disposed within the chamber, the chuck being configured to hold a wafer during a plasma etching process performed on the wafer; a focus ring disposed within the chamber, the focus ring surrounding the chuck, the focus ring being configured to control a direction of ions of the plasma etching process; a focus ring control system coupled to the focus ring, the focus ring control system being configured to adjust a vertical position of the focus ring relative to the wafer; and a detector disposed within the chamber, the detector being configured to detect the vertical position of the focus ring relative to the wafer.

In accordance with yet another embodiment, a method includes: performing an etching process on a wafer, wherein performing the etching process on the wafer includes: adjusting an etch direction of the etching process to a first desired etch direction; etching the wafer for a first time interval; adjusting the etch direction of the etching process to a second desired etch direction, the second desired etch direction being different from the first desired etch direction; and etching the wafer for a second time interval.

In accordance with yet another embodiment, a method includes: performing a plasma etching process on a wafer, wherein performing the plasma etching process on the wafer includes: adjusting a direction of ions used during the plasma etching processes to a first desired ion direction; etching the wafer for a first time interval; adjusting the direction of ions used during the plasma etching processes to a second desired ion direction, the second desired ion direction being different from the first desired ion direction; and etching the wafer for a second time interval.

In accordance with yet another embodiment, a method includes: mounting a wafer on a chuck disposed within a chamber of a plasma etching system, the wafer being surrounded by a focus ring; and performing a plasma etching process on the wafer, wherein performing the plasma etching process on the wafer includes: adjusting a direction of ions used during the plasma etching processes to a first desired ion direction by: detecting, by a detector of the plasma etching system, a detected vertical position of the focus ring; and moving, by a focus ring control system of the plasma etching system, the focus ring relative to the wafer from the detected vertical position to a first desired vertical position; etching the wafer for a first time interval; adjusting the direction of ions used during the plasma etching processes to a second desired ion direction by: moving, by the focus ring control system, the focus ring relative to the wafer from the first desired vertical position to a second desired vertical position, the second desired vertical position being different from the first desired vertical position, the second desired ion direction being different from the first desired ion direction; and etching the wafer for a second time interval.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing an etching process on a wafer, wherein performing the etching process on the wafer comprises:
mounting the wafer on a chuck disposed within a chamber of a plasma etching system, the wafer being encircled by a focus ring;
adjusting an etch direction of the etching process to a first desired etch direction, wherein adjusting the etch direction of the etching process to the first desired etch direction comprises adjusting a vertical position of the focus ring relative to the wafer to a first desired vertical position, and wherein adjusting the vertical position of the focus ring relative to the wafer to the first desired vertical position comprises:
detecting, by a detector of the plasma etching system, a detected vertical position of the focus ring;
generating, by the detector, a sense signal based on the detected vertical position;
receiving, by a feedback system of the plasma etching system, the sense signal or a user-generated signal generated by a user based on the first desired vertical position;
generating, by the feedback system, a control signal based on the sense signal or the user-generated signal;
receiving, by a focus ring control system of the plasma etching system, the control signal; and
moving, by the focus ring control system, the focus ring from the detected vertical position to the first desired vertical position;
etching the wafer for a first time interval;
adjusting the etch direction of the etching process to a second desired etch direction, the second desired etch direction being different from the first desired etch direction; and
etching the wafer for a second time interval.

2. The method of claim 1, wherein the detector comprises a laser detector, and wherein detecting the detected vertical position of the focus ring comprises:

transmitting, by the laser detector, a transmitted laser beam toward the focus ring;
receiving, by the laser detector, a reflected laser beam reflected from the focus ring; and
generating the sense signal based on the transmitted laser beam and the reflected laser beam.

3. The method of claim 1, wherein the focus ring control system is an actuator disposed within the chamber.

4. The method of claim 1, wherein the first time interval is different from the second time interval.

5. A method comprising:
performing a plasma etching process on a wafer, wherein performing the plasma etching process on the wafer comprises:
mounting the wafer on a chuck disposed within a chamber of a plasma etching system, the wafer being surrounded by a focus ring;
adjusting a direction of ions used during the plasma etching processes to a first desired ion direction, wherein adjusting the direction of ions used during the plasma etching processes to the first desired ion direction comprises adjusting a vertical position of the focus ring relative to the wafer to a first desired vertical position, and wherein adjusting the vertical position of the focus ring relative to the wafer to the first desired vertical position comprises:
detecting, by a detector of the plasma etching system, a detected vertical position of the focus ring; and
moving, by a focus ring control system of the plasma etching system, the focus ring relative to the wafer from the detected vertical position to the first desired vertical position;
etching the wafer for a first time interval;
adjusting the direction of ions used during the plasma etching processes to a second desired ion direction, the second desired ion direction being different from the first desired ion direction; and
etching the wafer for a second time interval.

6. The method of claim 5, wherein the first time interval is different from the second time interval.

7. The method of claim 5, wherein the first time interval is same as the second time interval.

8. The method of claim 5, wherein the first desired ion direction and a major surface of the wafer form a first angle, and wherein the first angle is less than 90 degrees.

9. The method of claim 8, wherein the second desired ion direction and the major surface of the wafer form a second angle, and wherein the second angle is greater than 90 degrees.

10. The method of claim 5, wherein etching the wafer for the first time interval comprises removing a first portion of the wafer along a first etching direction, and wherein etching the wafer for the second time interval comprises removing a second portion of the wafer along a second etching direction different from the first etching direction.

11. The method of claim 5, wherein the focus ring control system comprises an actuator.

12. The method of claim 5, wherein the detector comprises a laser detector.

13. A method comprising:
mounting a wafer on a chuck disposed within a chamber of a plasma etching system, the wafer being surrounded by a focus ring; and
performing a plasma etching process on the wafer, wherein performing the plasma etching process on the wafer comprises:
adjusting a direction of ions used during the plasma etching processes to a first desired ion direction by:
detecting, by a detector of the plasma etching system, a detected vertical position of the focus ring; and
moving, by a focus ring control system of the plasma etching system, the focus ring relative to the wafer from the detected vertical position to a first desired vertical position;
etching the wafer for a first time interval;
adjusting the direction of ions used during the plasma etching processes to a second desired ion direction by:
moving, by the focus ring control system, the focus ring relative to the wafer from the first desired vertical position to a second desired vertical position, the second desired vertical position being different from the first desired vertical position, the second desired ion direction being different from the first desired ion direction; and
etching the wafer for a second time interval.

14. The method of claim 13, wherein the focus ring has a non-vertical inner sidewall.

15. The method of claim 14, wherein the non-vertical inner sidewall and a bottommost surface of the focus ring form a first angle, and wherein the first angle is between about 30 degrees and about 60 degrees.

16. The method of claim 13, wherein an inner diameter of the focus ring is between about 302 mm and about 314 mm.

17. The method of claim 13, wherein a width of the focus ring is between about 20 mm and about 30 mm.

18. The method of claim 13, wherein the detector is a laser detector.

19. The method of claim 1, wherein the focus ring has a trapezoidal shape.

20. The method of claim 19, wherein a base angle of the trapezoidal shape is between about 30 degrees and about 60 degrees.

* * * * *